(12) United States Patent
Keinert et al.

(10) Patent No.: US 7,971,171 B2
(45) Date of Patent: Jun. 28, 2011

(54) METHOD AND SYSTEM FOR ELECTROMIGRATION ANALYSIS ON SIGNAL WIRING

(75) Inventors: Joachim Keinert, Altdorf (DE); Howard H. Smith, Beacon, NY (US); Patrick M. Williams, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 12/123,769

(22) Filed: May 20, 2008

(65) Prior Publication Data
US 2009/0013290 A1    Jan. 8, 2009

(30) Foreign Application Priority Data
Jul. 3, 2007 (EP) .................................. 07111600

(51) Int. Cl.
*G06F 17/50* (2006.01)
(52) U.S. Cl. ......... 716/115; 716/112; 716/113; 716/136
(58) Field of Classification Search .................. 716/1, 2, 716/4, 5, 6, 111, 112, 113, 115, 125, 136
See application file for complete search history.

(56) References Cited

U.S. PATENT DOCUMENTS

| | | | | |
|---|---|---|---|---|
| 5,831,867 A | * | 11/1998 | Aji et al. ............................ | 716/4 |
| 6,532,570 B1 | * | 3/2003 | Mau ................................... | 716/2 |
| 6,578,178 B2 | * | 6/2003 | Mau ................................... | 716/2 |
| 6,728,942 B2 | * | 4/2004 | Lampaert et al. ............... | 716/10 |
| 6,857,113 B2 | | 2/2005 | Gentry et al. | |
| 6,954,814 B1 | | 10/2005 | Leach | |
| 6,954,914 B2 | | 10/2005 | Sundar et al. | |
| 7,043,705 B2 | | 5/2006 | Somayaji et al. | |

OTHER PUBLICATIONS

SPICE from Wikipedia, the free encyclopedia, SPICE( simulation Program with Integrated Circuit Emphasis), http://en.wikipedia.org/wiki/SPICE.

* cited by examiner

*Primary Examiner* — Sun J Lin
(74) *Attorney, Agent, or Firm* — Wenjie Li (57) ABSTRACT

The invention relates to an electromigration analysis method and a system for analyzing one or more nets in a digital integrated circuit design that are at risk of electromigration. The method comprises the steps of providing at least one interconnect between a driver cell and at least one load cell; applying same extracted netlist data for noise and/or timing analysis and for electromigration analysis; modeling the driver cell by a train of trapezoidal voltage pulses transmitted from the driver cell to the one or more load cells through the at least one interconnect; extracting at least a slew rate of a driver voltage signal and/or timing information from a noise and/or timing analysis for the one or more nets; and comparing a locally measured current density in the at least one interconnect to an effective local maximum current density limit of the at least one interconnect.

22 Claims, 6 Drawing Sheets

METHOD AND SYSTEM FOR ELECTROMIGRATION ANALYSIS ON SIGNAL WIRING

FIELD OF THE INVENTION

The invention relates to an electromigration analysis on signal wiring. Specifically, an electromigration analysis method and system are provided which maintain topological information on local electromigration risks.

BACKGROUND OF THE INVENTION

Modern integrated circuit designs are becoming more and more complex and compact. Generally, integrated circuits encompass several electronic components such as logic gates, flip-flops, comparators, multiplexers etc. Components in an integrated circuit are interconnected using interconnections such as metal wires, which are also referred to as signal leads or signal wires. A signal wire is typically designed to transfer a signal from a component, known as driver cell, to another component, known as receiver cell or load cell. The signal, when transferred, is characterized by several parameters, particularly current density parameters such as average value, "rms" current densities (rms=root mean square), peak current densities and the like. In order to ensure that the current density parameters do not exceed corresponding pre-defined threshold values when the circuit is used later after fabrication, the current density parameters on signal leads usually are estimated during the design of an integrated circuit.

Simulation tools are known in the art which consider a digital representation of the integrated circuit. A software program for simulation of analog, digital or mixed electronic circuits well known in the art is the SPICE program (SPICE=Simulation Program with Integrated Circuit Emphasis), which is currently used for such simulations. The basic function of the interactive SPICE simulation is finding algorithmic approximate solutions for differential equations which describe the system. Their context is defined by the circuit topology and is transferred to the simulator via a net list which describes the components and their interconnections. A net is a direct interconnect between a driver cell and one or more load cells. The components can be described either by physical oriented models or can be described in a completely abstract way. In the latter case, a subsystem is then described by inputs and outputs and affiliating equations only instead of building it from single components. The simulation can employ virtual measuring devices such as amperemeters, network analyzers, logic analyzers and the like yielding measured values of parameters of the integrated circuit under analysis.

In state-of-the-art integrated circuits more devices are compressed in the integrated circuits to improve the performance. However, the currents in these devices typically remain comparable despite increasing miniaturization of the integrated circuits. With higher current density the integrated circuits become more susceptible to electromigration which causes the integrated circuit to fail.

The metallic conductors that carry current between various components on the chip are usually arranged in dense arrays. At high current densities a net atomic flux can be induced by a transfer of electron momentum to the atoms in the crystalline structure of the metallic conductors. The atomic flux results in voids which can cause a circuit the break open or in hillocks, e.g. accumulation metal leading to shorts with adjacent metal lines. A current running through a signal line may heat due to Joule heating and thus induce a temperature increase in neighboring electric lines and vice versa. In order to avoid deleterious effects occurring in the neighboring lines, the maximum temperature of signal lines should be limited.

It is desirable to determine the current density and the electromigration risk early in the design cycle as it becomes difficult to make appropriate adjustment in the design without adding considerable amount of time delays to the design cycle. Various solutions have been suggested so far for determining the current density and electromigration risks of signal nets in the integrated circuit early in the design cycle.

The U.S. Pat. No. 7,042,705 discloses a method which encompasses a driver cell modeled by triangle current pulses with properties derived from characterization of the driver cell by given formulas. A SPICE-like simulation is employed. The wiring is modeled as an impedance network.

A similar approach employing an impedance network as wiring model and SPICE-like simulation is described in the U.S. Pat. No. 6,954,914, wherein the driver cell is replaced by a simplified "appropriate" cell (e.g. inverter, buffer, etc.) of the same driving capability. As a result it can be determined if a whole net fails.

The U.S. Pat. No. 6,857,113 suggests modeling the wiring as an effective capacitance and employs a driver current ramp from timing analysis. A pre-selection of potential failures is possible. However, a detailed net simulation is necessary for verifying that the net fails.

In view of the foregoing, there is a need for revealing more details of net failures caused by electromigration, particularly determining individual failing areas in a signal wire net.

SUMMARY OF THE INVENTION

The objects of the invention are to provide an improved method and an improved system for electromigration analysis on signal wiring in such a way as to maintain topological information during electromigration analysis to improve wiring quality.

These objects are achieved by the features of the independent claims. The other claims and the specification disclose advantageous embodiments of the invention.

According to a first aspect of the invention, an electromigration analysis method is proposed for analyzing one or more nets in a digital integrated circuit design that are at risk of electromigration. The method comprises the steps of providing at least one interconnect between a driver cell and a load cell; applying same extracted netlist data for noise and/or timing analysis and for electromigration analysis; modeling the driver cell by a train of trapezoidal voltage pulses transmitted from the driver cell to the load cell through the at least one interconnect; extracting at least a slew rate of a driver voltage signal and/or timing information from a noise and/or timing analysis for the one specific net; comparing a locally measured current density parameter in the at least one interconnect to an effective local maximum current-density-parameter limit of the at least one interconnect. Particularly, the electromigration violations on is signal lines can be detected with high accuracy. The current density parameter can preferably be a root-mean-square of the current density. However, a suitable parameter can also be an average current density, corresponding to a dc (direct current) on the signal line and/or a peak current density. A violation can be flagged if one of these parameters or any combination of two or three of the parameters is above the limit. Favorably, the electromigration calculation is accurate and consistent with noise and/or timing analysis as both are based on the same data. Even if design data are changed during the design process of the chip, the data can stay consistent. In the art, when referring to "measured" values extracted form a SPICE-type analysis a "measurement" is done by simulating the parameter and performing the "measurement" by inserting virtual amperemeters in each resistor section of the interconnections.

No extra driver characterization is necessary, thus simplifying the modeling. Individual failing segments and/or vias can be easily identified. A typical noise analysis considers crosstalk effects between adjacent lines and uses high-speed driver with high voltages and high current. A typical timing analysis uses relatively pessimistic time parameters at lower voltages, usually using relatively slow drivers. However, timing analysis can also be done with high-speed drivers. Favorably, at least the slew rate and probably a load capacity of one or more load cell can be taken from the timing analysis run of the complete chip or from a run of a part of the chip using detailed wire models. Preferably, cycle time and switching factor used for the driver voltage signals can be determined from the same timing run. Cycle time is characterized by the frequency extracted from a design database for the chip considered. Generally, the cycle time is the reciprocal value of the clock frequency. The switching factor can be defined or calculated for specific functions. The switching factor, generally, describes how often a signal switches per clock cycle. The switching factor for a clock signal usually is defined as 1, whereas the switching factor for a data signal is below 1, e.g. 0.2 or the like. The voltage levels are preferably extracted from a design database used in the layout of the chip.

The applying trapezoidal voltage pulses with a slew rate from the noise and/or timing analysis yields a realistic model of the driver cell. Trapezoidal voltage pulses lead to a decaying step wire current. Other than this a triangular voltage pulse known in the art leads to an approximately rectangular wire current, and a triangular current pulse leads to an approximate triangular wire current.

Preferably, each segment of an interconnection of a net can be annotated by its layer number, wire width and/or coordinates in the net generated as layout extraction data. Thus, detailed and accurate geometrical data are available and allow estimating the local thermal load on the interconnections caused by a current flow. If a good thermal conduction and/or a good removal of excess heat is possible, the current density limit can be higher than in a case where surrounding elements of the electric circuit thermally isolate the segment and/or via or even add thermal load to the segment and/or via. The accuracy of the electromigration analysis can be increased.

By setting an individual maximum effective current density limit for each segment and/or via between metal layers of the interconnections, the accuracy of the analysis can be increased further. Typically, the electric conductors forming vias are of standard size and thickness defined by the fabrication technology process used for preparing the integrated electric circuit. Therefore, the current density limits of the vias are dependent mainly on the via position. Preferably, each via of a redundant array can be handled individually. However it is possible to handle all vias of a redundant array at once as a complete array of vias. A redundant array of vias is to be understood as two or more parallel vias establishing an electric contact between a segment of a specific net in a first metal layer to a segment of the same net in another metal layer. This provides a safe electrical contact between segments running in different metal layers as during processing a chip there is a finite probability that a via cannot be opened and is thus electrically insulating.

A further increase of the accuracy is possible if each maximum effective current density is a function of layer number and wire width of each segment.

Preferably, the interconnections can be modeled as an impedance network with one or more resistors and one or more capacitors (RC-model). A model of an impedance network consisting of one or more resistors, one or more capacitors and one or more inductivities is also possible (RCL-model). Preferably, each wire segment and each via is represented by its own RC- or RCL-model.

According to a preferred method step, a current density in the at least one segment and/or via can be measured by a SPICE-type analysis.

In a further advantageous method step the accuracy of the analysis can be increased if a DC component in the measured current density values can be eliminated. This can be done by reading the value at the end of the train of voltage pulses sent by the driver cell. For example, if the pulse train consists of ten pulses, the reading of the value can be done at the tenth pulse. By doing so, the measured current density values are automatically averaged which in turn eliminates the DC component.

Favorably, a final root-mean-square value of the current density can be estimated with high accuracy because of the elimination of the DC component.

A failure of individual wire segments and/or vias can be determined by comparing measured current density parameters and effective current density parameters against limits for each segment and/or via. The parameters can be at least one of root-mean-square current density, average current density and peak current. Generally, for a sinusoidal current, the peak current is the current amplitude divided by the square root of 2. An average current for a sinusoidal current is zero and equivalent to the dc component of the current signal.

A data processing program is proposed for execution in a data processing system comprising software code portions for performing the method elucidated before when said program is run on a computer.

A program product stored on a computer usable medium is proposed comprising computer readable program means for causing a computer to perform the method elucidated before when said program is run on a computer.

According to another aspect of the invention a program product stored on a computer usable medium is proposed comprising computer readable program means for routing electric circuits placed on a chip, wherein the computer readable program when executed on a computer causes the computer to provide at least one interconnect between a driver cell and a load cell; apply same extracted netlist data for noise and/or timing analysis and for electromigration analysis; model the driver cell by a train of trapezoidal voltage pulses transmitted from the driver cell to the load cell through the at least one interconnect; extract at least a slew rate of a driver voltage signal and/or timing information from a noise and/or timing analysis for the one or more nets; compare a locally measured current density in the at least one interconnect to an effective local maximum current density limit of the at least one interconnect.

The foregoing is a summary and thus contains, by necessity, simplifications, generalizations and omissions of detail. Consequently, those skilled in the art will appreciate that the foregoing summary is illustrative only and not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention together with the above-mentioned and other objects and advantages may better be understood from the following detailed description of the embodiments, but not restricted to the embodiments, in conjunction with the accompanying drawings which show:

FIG. 4d a final current signal for estimating a current density violation in the specific wire segment in FIG. 4a;

FIG. 5b a detail of a logic system of the preferred computer system of FIG. 5a.

DETAILED DESCRIPTION OF THE INVENTION

The drawings are merely schematic representations, not intended to portray specific parameters of the invention. Moreover, the drawings are intended to depict only typical embodiments of the invention and therefore should not be considered as limiting the scope of the invention. In the drawings, like elements are referred to with equal reference numerals.

Generally, the present invention provides a method analyzing probable local failures of wire segments and vias due to electromigration. As the analysis maintains topological information throughout the analysis adjustment of the layout and/or wiring is facilitated and reduced to the areas where adjustment is needed. Local failures can directly be flagged by comparison of readout of the analysis and against annotated maximum limits of effective current and peak current densities.

Figure 1A:
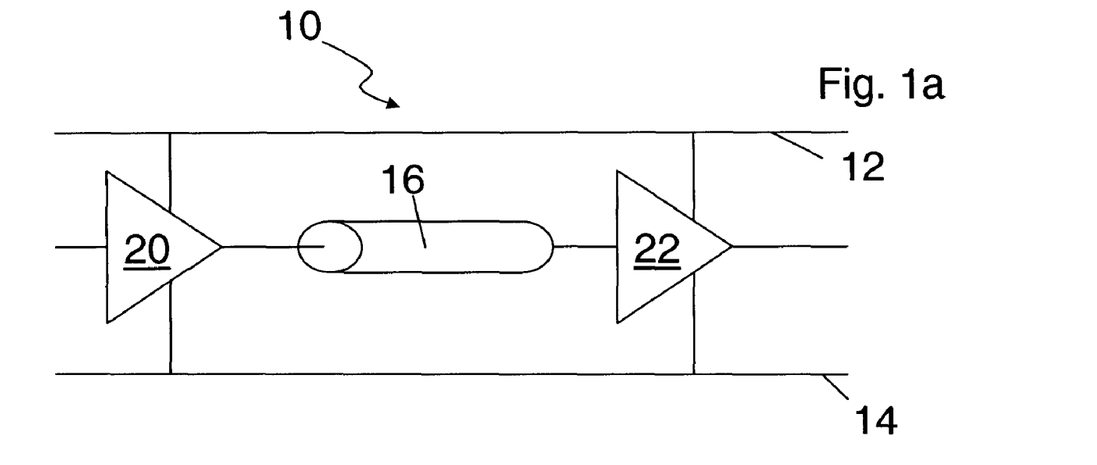
FIG. 1a a schematic sketch of a driver and a receiver cell in a net.
Figure 1B:
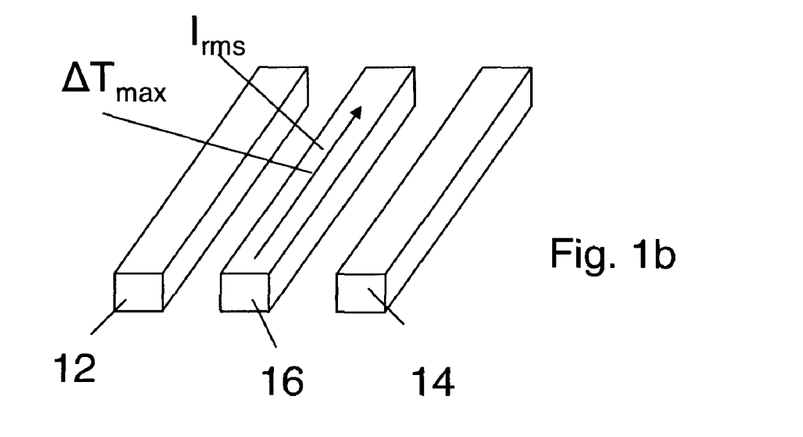
FIG. 1b a signal line between two power/ground lines.
Figure 1C:
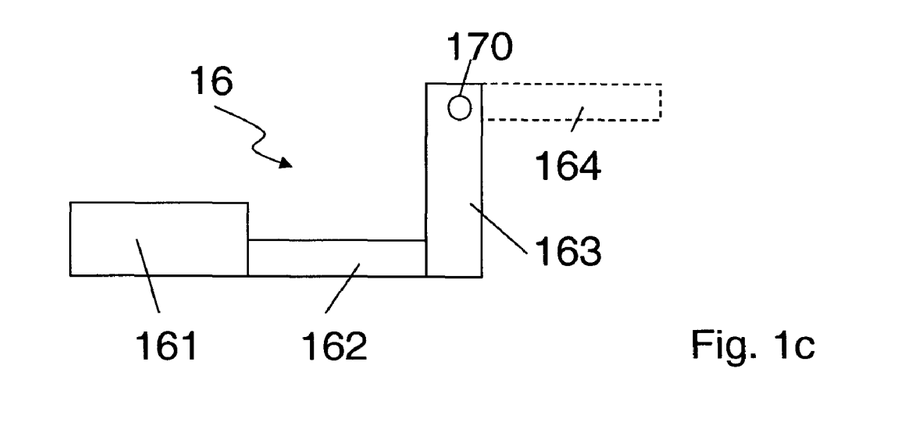
FIG. 1c a detail of a signal line divided into segments.

Designing a chip with integrated electronic circuits starts out from a netlist which comprises a description of the cells and their interconnections. FIGS. 1a through 1c depict a schematic sketch of a net 10 and details of the net 10 comprising a driver cell 20 and a load cell 22 which receives a signal from the driver cell 20 through a signal wire as interconnect 16 between the driver and the load cell 20, 22. The signal wire interconnect 16 is arranged juxtaposed to a ground and a power line 12, 14. The lines 12 and 14 are not members of net 10 but of other nets, e.g. power nets. Bidirectional current on the interconnect 16 causes Joule heating due to the electrical resistance of the interconnect 16. Joule heating causes a temperature increase in neighboring circuitry. Design guidelines usually limit a temperature increase to $\Delta T_{max}$ by limiting $I_{rms,max}$ values per layer with a function of wire width. Generally, a rms-value of a continuous function, i.e. current or current density $I_{rms}$ (rms=root mean square) can be defined by a formula defined over an interval $T_1 \leq t \leq T_2$ $$I_{rms} = \sqrt{\frac{1}{T_2 - T_1} \int_{T_1}^{T_2} [I(t)]^2 dt}$$

wherein the rms of a periodic function is equal to the rms of one period of the function.

The effect of averaging square values is that outlier values are weighted relatively strong, thus automatically taking into consideration that the root-mean square current density $I_{rms}$ of currents may lead to electromigration effects.

The signal wire interconnect 16 is partitioned in segments 161, 162, 163, 164. The segments can be of equal or different length, e.g. 100 µm, 200 µm or the like. The last segment 164 is e.g. in a metal layer below the metal layer in which segments 161 through 163 are arranged. Segments 163 and 164 are vertically connected through a via 170. The segments 161 through 164 typically are of same thickness and can be of equal or different widths. Vias 170 are typically of standard sizes and vary only in position through the signal line 16 of net 10.

Figure 2:
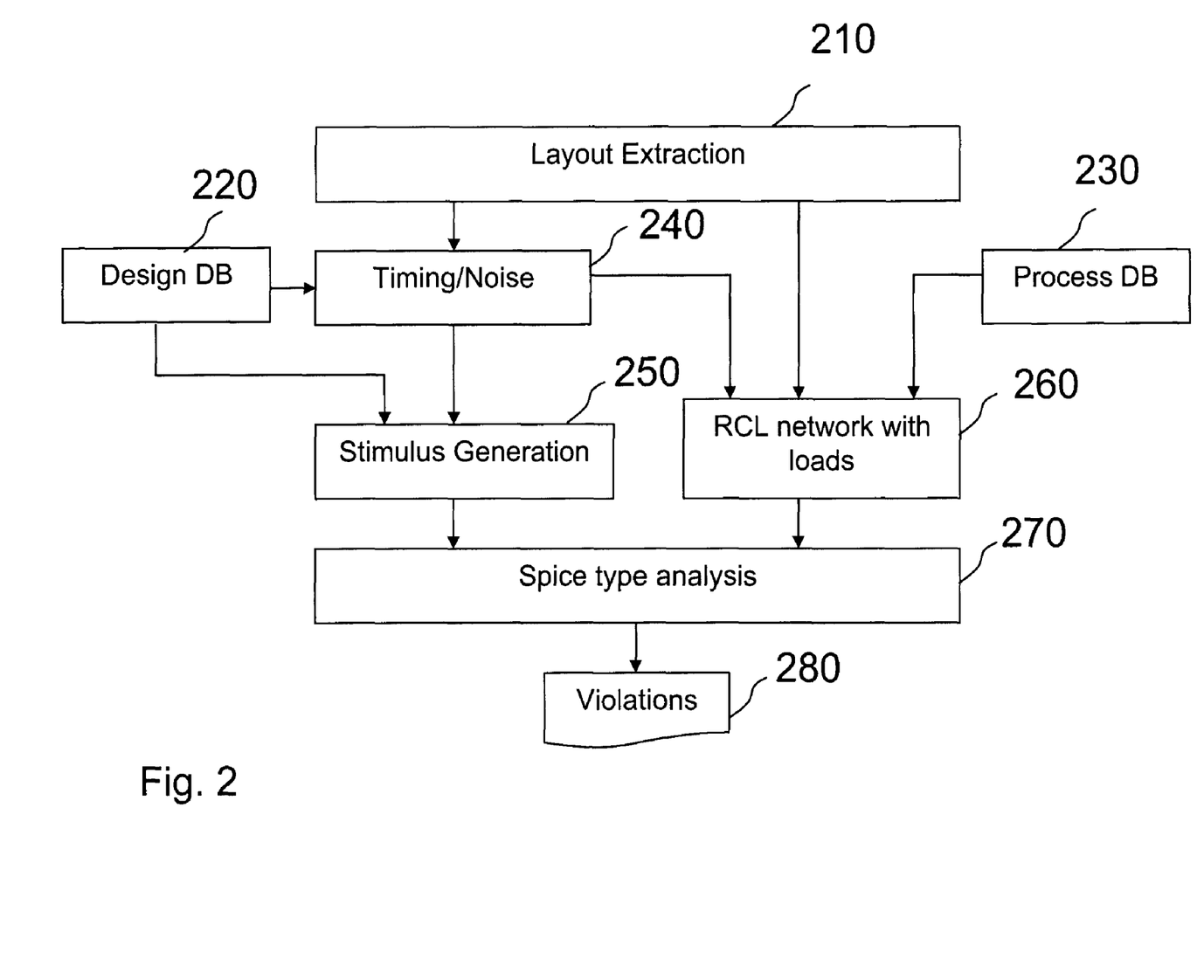
FIG. 2 a flow chart of a preferred method for analyzing an electromigration risk in a net.

FIG. 2 shows a flow chart which elucidates a preferred embodiment of the invention. In a layout extraction block 210, layout data such as a netlist for driver and load cells 20, 22 and interconnections 16—by way of example shown in FIG. 1a through 1c—are extracted and provided to a noise and/or timing analysis block 240 and a RCL network block 260. Layout data extracted preferably are an instance name of the driver, interconnect details for each segment, electrical properties of the segments such as resistance, capacitance, and load cell load capacities for the one or more load cells. The instance names of the load and driver cells are supplied to block 240, as well as timing rules for each cell and Macro, clock specifications, chip input slew rates, cycle time, chip output load capacitance from the design database 220. The load capacitances and RCL netlist are supplied to the block 260.

The RCL network block 260 models the segments 161, 162, 163, 164 of the interconnect 16 and via 170. Other parameters provided are wire segments characterized by their coordinates, wire widths and layer and vias, which are vertical to the layers and electrically connect segments running in different layers. The vias need particularly be characterized only by their coordinates as they generally are of standard size.

In the noise and/or timing analysis block 240, among other noise and/or timing information, slew rates of the driver cell signal, switching times are generated. Driver slew, capacitance and cycle times are submitted to a stimulus generation block 250 (driver slew, capacitance and cycle times) and the RCL network block 260 (capacitance).

The RCL network block 260 generates a SPICE netlist and provides RC or RCL-models for each segment 161, 162, 163, 164 and via 170 of the interconnections 16 in all nets 10. Additionally, the RCL network block 260 receives data from a process data base 230 which contains information on the technology used, the semiconductor, insulator and metal materials used, layer thicknesses, wire widths, maximum current densities, and the like.

A typical number of metal layers is between 10 to 12 (M1-M12). Generally, interconnections 16 can be arranged in a single metal layer but can also be arranged in multiple metal layers, depending on layout, design etc. Each segment 161, 162, 163, 164 of each interconnect 16 is annotated by its layer, wire width and coordinates. Each via 170 is annotated by its layer and its coordinates. Additionally, each segment 161, 162, 163, 164 is annotated by its maximum effective current density limit $I_{rms,max}$ as a function of its layer and wire width. The process database 230 particularly provides current density parameters for particular configurations for one or more vias on a particular metal layer and for a wire on a particular metal layer as a function depending on wirewidth. For each segment wirewidth and layer is provided. Thus, the maximum current density of maximum current for each segment and for each via can be extracted from a look-up-table or can be calculated using the wirewidth-depending function.

Current density is used synonymously with current as the geometry of the segments is known. If one parameter is known, the other can thus be derived easily. Particularly, the current density parameter can be at least one of root-mean-square current density, average current density, peak density.

A design database 220 provides design parameters for the integrated circuit chip which are entered into the stimulus generation block 250 in par with the timing and/or noise data of the noise and/or timing analysis block 240. Such design parameters are e.g. the operation frequency or the cycle time used for the electric circuit and voltages.

In the stimulus generation block 250 a train of voltage pulses is formed which models the driver cells 20. The voltage pulses are of trapezoidal shape with a slew rate extracted from the noise and/or timing analysis block 240. The voltage level is extracted from the design database 220.

The output data of stimulus generation block 250 and RCL network block 260 are fed into the SPICE type analysis block 270. As a result of the SPICE type analysis in block 270, segments 161, 162, 163, 164 and vias 170 which violate the maximum current limits and are thus at risk of electromigration are flagged directly by comparison of readout from the analysis block 270 against annotated maximum current densities $I_{rms,max}$ per wire segments 161, 162, 163, 164 or vias 170 in violation block 280. If average current density or peak current density are provided instead, the analysis considers a limit related to the parameter considered. If more than one current density parameter is considered, a violation is flagged if at leas one of the current density parameter exceeds its respective maximum limit.

Figure 3:
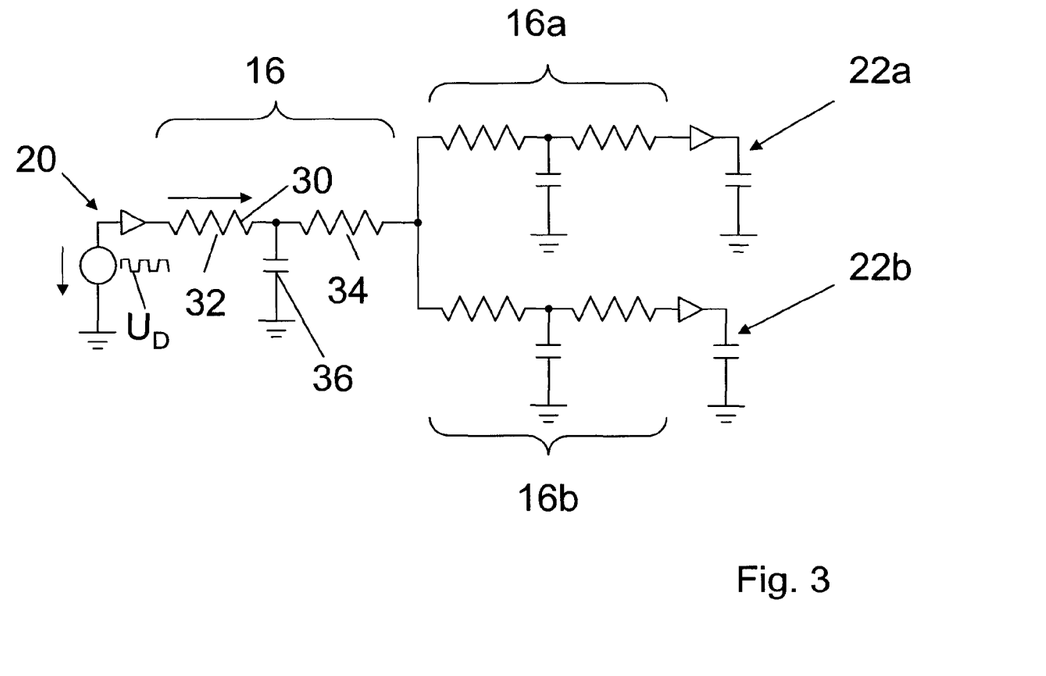
FIG. 3 a schematic setup representing a driver cell and two receiving load cells.

FIG. 3 shows a schematic setup representing a driver cell 20 and two receiving load cells 22a, 22b connected by interconnections 16, 16a and 16b. FIGS. 4a through 4d depict voltage and current signals used in the analysis in SPICE type analysis block 270 (FIG. 2) based on the models shown in FIG. 3.

The driver cell 20 in FIG. 3 is modeled as a train of trapezoidal voltage pulses with a voltage $U_D(t)$. The interconnections 16, 16a, 16b are modeled by RC-models, wherein for clarity reasons details are shown only for interconnect 16.

The interconnect 16 consists of several segments, a segment comprising a capacitor 36 and a resistor 30 exhibiting a resistance R. In the electric model, the resistor 30 comprises a resistor section 32 and a resistor section 34, which each have a resistance R/2. The capacitor 36 connects the center tap of the resistor 30 to ground potential. In the SPICE-type analysis, the current density parameters for each resistor segment 32, 34 of the resistor 30 is determined.

The trapezoidal voltage pulses of the driver cell 20 result in a current through the resistor parts 32, 34. By way of example, FIGS. 4a through 4d show voltage and currents, respectively, measured on a particular segment 32 of interconnect 16. The current is indicated by a horizontal arrow above resistor section 32. The $I_{rms}$ current can be measured during the SPICE type analysis by virtual amperemeters in each resistor section of the interconnections 16, 16a, 16b. By knowing the geometrical dimensions of the interconnections and segments, a current density can easily be derived from a measured current.

Figure 4A:
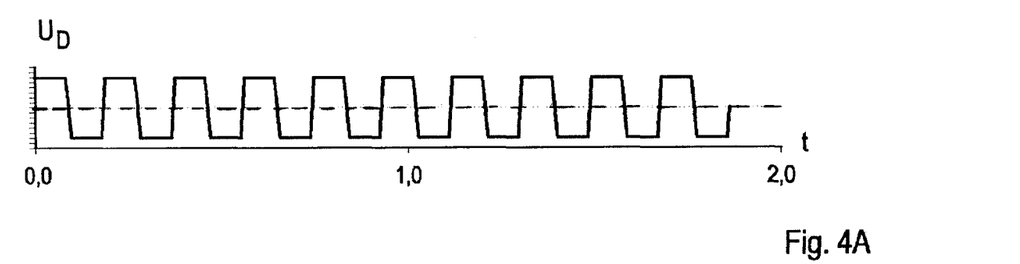
FIG. 4a a preferred voltage signal of a preferred driver cell.
Figure 4B:
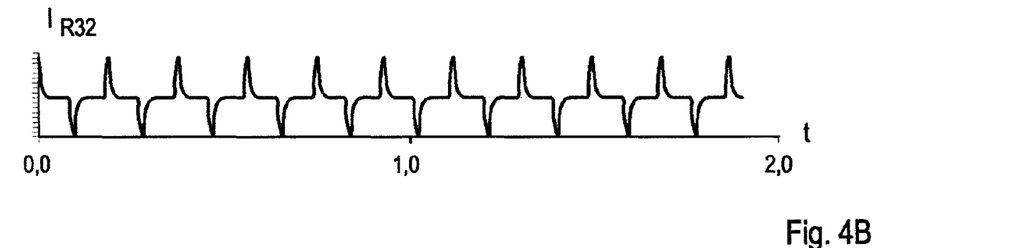
FIG. 4b a current measured in response of the driver voltage signal of FIG. 4a in a signal line.

The train of voltage pulses, e.g. ten pulses, which represents the driver cell 20 is shown in FIG. 4a as a function of time t $U_D(t)$. The slew rate of the pulses is a few ps, e.g. 10 ps. The current resulting from the stimulus train of voltage pulses measured in a resistor section R32 is shown in FIG. 4b. The rising edges of the voltage pulses result in a current peak to positive voltage values and the falling edges of the voltage pulses result in current peaks to negative voltage values.

Figure 4C:
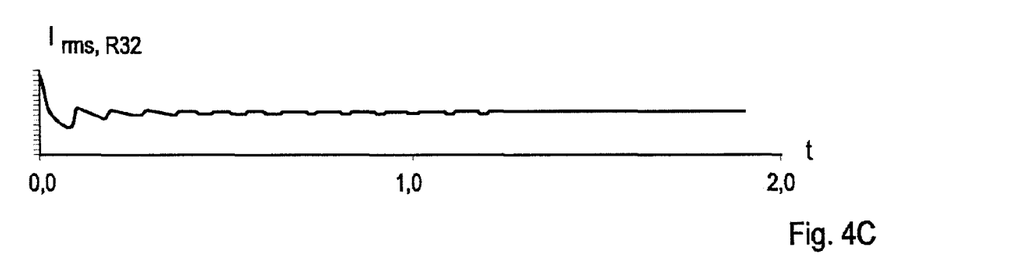
FIG. 4c a calculated current signal for the specific wire segment of FIG. 4b.
Figure 4D:
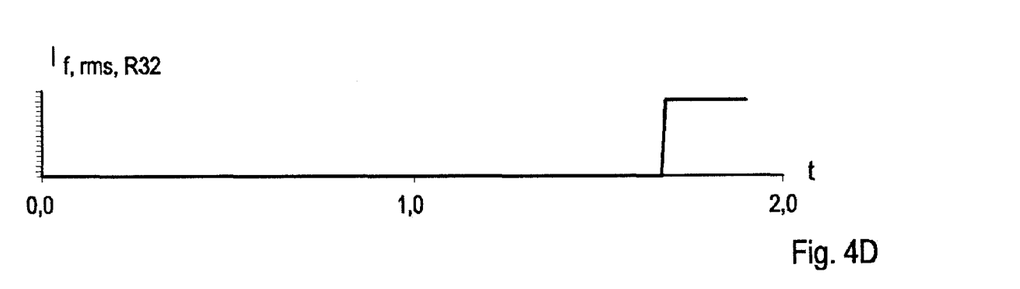

By calculating and averaging the current and building a "rms" current value according to FIG. 4c an effective average current $I_{rms}$ is generated (or measured in the SPICE analysis) for segment 32. The calculation is done with the same current values as measured in FIG. 4b. At the beginning of the current characteristic shown, the value of $I_{rms,R32}$ is very high due to calculation effects close to zero. At higher pulse numbers/time values, the current characteristic $I_{rms,R32}$ is a constant parallel to the time axis. FIG. 4d shows a result of the analysis, wherein the current value is measured in e.g. the tenth period of the voltage pulses/current peaks according to FIG. 4a and FIG. 4b, showing a step function of the current $I_{f,rms,R32}$. This current value at the step is compared to the maximum current limit or the respective maximum current density limit according which is defined for the specific segment 32. If the measured value $I_{f,rms,R848}$ is higher than the limit, segment 32 is flagged as violation. Particularly, the location of the segment is reported also. If the value $I_{f,rms,R32}$ is lower than the limit, segment 32 is within the desired values and not at risk of electromigration.

Figure 5A:
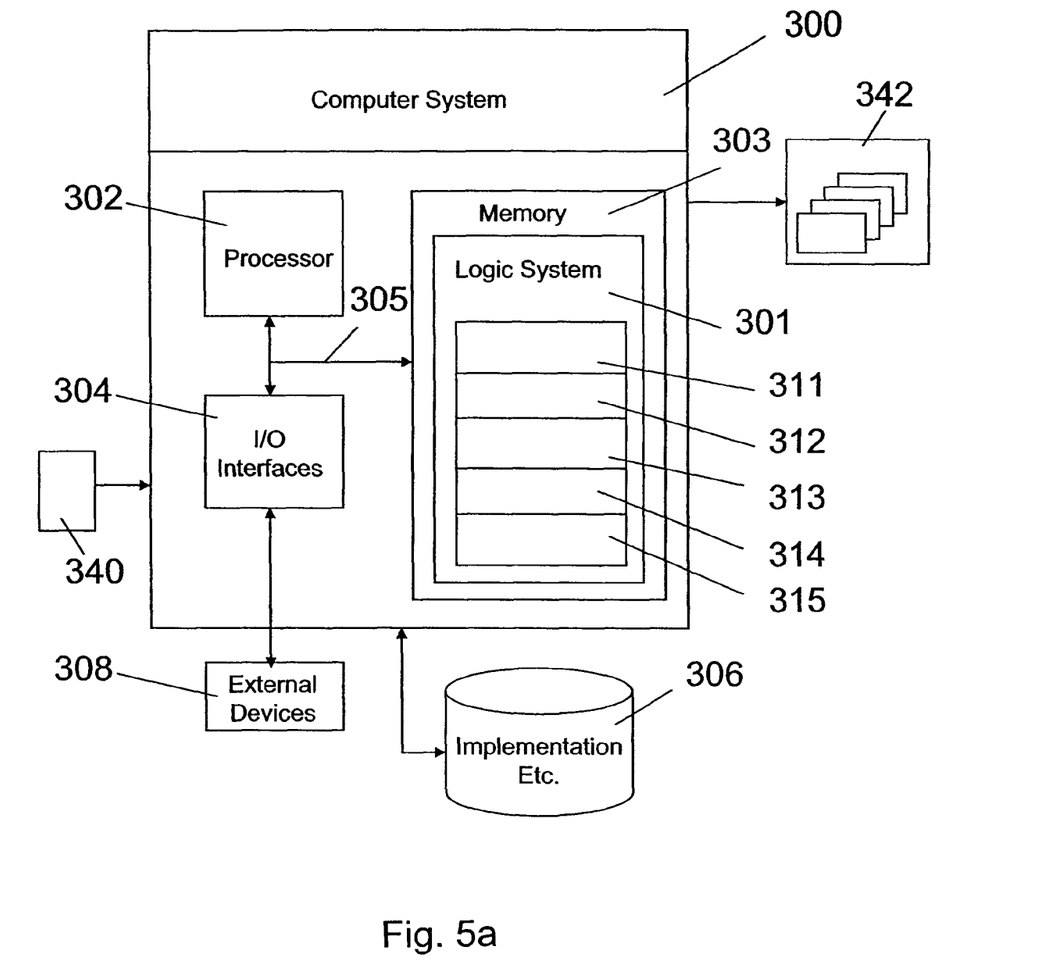
FIG. 5a a preferred computer system employing a preferred computer program product.
Figure 5B:
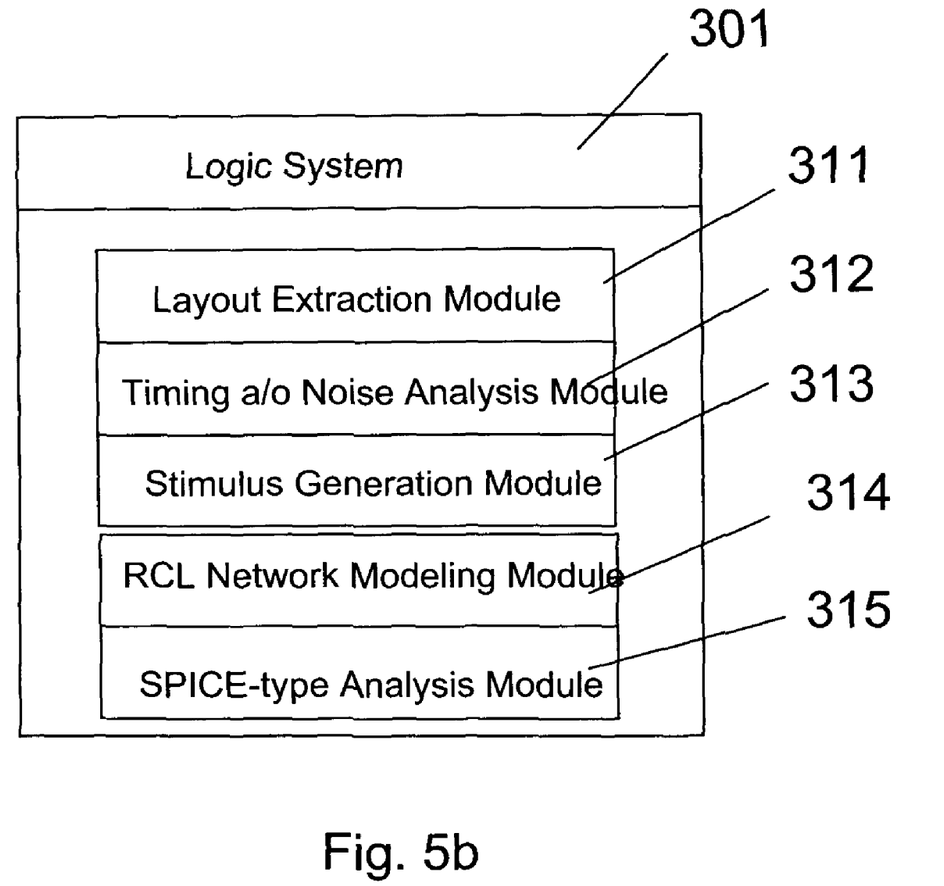

Referring now to FIGS. 5a and 5b, a computer system 300 implementation of the present invention is shown. Specifically, the present invention can be implemented as a computer system 300 and/or program product 301 for conducting an electromigration analysis for electric circuits in integrated circuit chip design. This allows user 340 to run simulations after performing placement of the circuits for establishing reliable wiring in the circuits. As depicted, computer system 300 generally comprises a processor subsystem 302, a memory 303, an input/output (I/O) interface 304, a bus subsystem 305, a database 306 as well as external devices 308.

Processor subsystem 302 encompasses the central processing unit (CPU) as well as any secondary processing devices, for example arithmetic processing unit, coupled to the CPU by the bus subsystem 305. Processor subsystem may comprise a single processing unit, or be distributed across one or more processing units in one or more locations, e.g., on a client and server. Memory 303 may comprise any known type of data storage and/or transmission media, including magnetic media, optical media, random access memory (RAM), read-only memory (ROM), a data cache, a data object, etc. Moreover, memory 303 may reside at a single physical location, comprising one or more types of data storage, or be distributed across a plurality of physical systems in various forms.

I/O interface 304 may comprise any system for exchanging information from an external source. External devices 308 may comprise any known type of external device, including speakers, a CRT, LED screen, hand-held device, keyboard, mouse, voice recognition system, speech output system, printer, monitor, facsimile, pager, etc. Bus 305 provides a communication link between each of the components in the computer system 300 and likewise may comprise any known type of transmission link, including electrical, optical, wireless, etc. In addition, although not shown, additional components, such as cache memory, communication systems, system software, etc., may be incorporated into computer system 300.

Database 306 provides storage for information necessary to carry out the present invention. Such information could include, inter alia: (1) layout data; (2) design data; (3) process data; (4) wiring quality data; etc. Database 306 may include one or more storage devices, such as a magnetic disk drive or an optical disk drive. In another embodiment database 306 includes data distributed across, for example, a local area network (LAN), wide area network (WAN) or a storage area network (SAN) (not shown). Database 306 may also be configured in such a way that one of ordinary skill in the art may interpret it to include one or more storage devices. Moreover, it should be understood that database 306 could alternatively exist within computer system 300.

Stored in memory 303 is logic system 310. As depicted, logic system 310 generally includes layout extraction module 311, timing and/or noise module 312, stimulus generation module 313, RCL network generation module 314 and SPICE-type analysis module 315. The systems shown herein carry out the functions described above.

Based on the layout extraction data of layout extraction module 311 and timing data of timing and/or noise module 312, stimulus generation module 313 will provide a trapezoidal voltage signal which the driver cell applies to a signal line which is modeled by RCL network generation module 314. SPICE type analysis module 315 will compare current densities of wire segments in the RCL model to a reference upper limit of current density in the respective wire segment and will pinpoint current density violations, yielding an output for output module 342.

Each of the software modules 311 through 315 is comprised of a set of instructions which are encoded in memory 303 as computer readable program code and executable by processor subsystem 302. Typically, the software modules 311 through 315 will be stored in auxiliary memory of memory subsystem 303 prior to the execution thereof. External device 308, e.g. a CD-ROM or file transfer software, is used to copy the modules 311 through 315 into the auxiliary memory of memory subsystem 303.

The functionality provided by the software modules 311 through 315 may be encoded in the memory 303 and/or in computer usable medium as discrete programs, each containing computer readable program code. Alternately, the functionality provided by the software modules 311 through 315 may be encoded in the memory 303 and/or in computer usable medium as separate subroutines of a single computer program containing plural computer readable program subcodes. Furthermore, while any of the software modules 311 through 315 may be executed separately, typically the layout extraction module 311 will be initially executed by the processor 303, followed by noise and/or timing analysis module 312 and stimulus generation module 313. Data of RCL network analysis module 314 and stimulus generation voltage signals will enter SPICE type analysis module 315 and violations of current densities in wire segments will be detected if present. Of course, any of the software modules 311 through 315 may call any other one of the software modules 311 through 315 to perform certain functions on its behalf.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer readable medium providing program code for use by or in connection with a computer or any instruction execution system. For the purposes of this description, a computer-usable or computer readable medium can be any apparatus that can contain, store, communicate, propagate, or transport the program for use by on in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

The invention claimed is:

1. An electromigration analysis method implemented by a computer system for analyzing one or more nets in a digital integrated circuit design that are at risk of electromigration, comprising:
    providing at least one interconnect between a driver cell and one or more load cells;
    applying same extracted netlist data for an electromigration analysis and at least one of the following: a noise analysis and a timing analysis;
    modeling the driver cell by the computer system by a train of trapezoidal voltage pulses transmitted from the driver cell to the one or more load cells through the at least one interconnect;
    extracting by the computer system at least a slew rate of a driver voltage signal and at least one of the following: noise information and timing information from the noise analysis and the timing analysis for the one or more nets; and
    comparing a locally measured current density in the at least one interconnect to an effective local maximum current density limit of the at least one interconnect.

2. The method of claim 1, further comprising:
    partitioning the at least one interconnect into segments and/or vias and annotating each segment by its layer number and at least one of the following: wire width and coordinates in the one or more nets generated as layout extraction data.

3. The method of claim 2, further comprising:
    setting an individual maximum effective current density for each segment and/or via.

4. The method of claim 3, wherein each maximum effective current density is a function of layer number and wire width of each segment.

5. The method of claim 2, further comprising:
    measuring by a SPICE-type analysis a current density in at least one of the following: at least one segment and a via.

6. The method of claim 1, further comprising:
    setting an individual maximum current density limit for each via connection between metal layers of the interconnect.

7. The method of claim 6, further comprising:
    handling each via of a redundant array individually.

8. The method of claim 6, further comprising:
    handling all vias of a redundant array at once.

9. The method of claim 1, further comprising:
    modeling the at least one interconnect as an impedance network.

10. The method of claim 1, further comprising:
    averaging the locally measured current density.

11. The method of claim 1, further comprising:
    eliminating a DC component in the locally measured current density.

12. The method of claim 11, further comprising:
    estimating a maximum value of the locally measured current density after elimination of the DC component.

13. The method of claim 1, further comprising:
    determining a failure of at least one of the following: each wire segment and each via, wherein the determining is performed by comparing the locally measured current density and the effective local maximum current density limit of at least one of the following: each segment and each via.

14. A non-transitory program product stored on a computer usable medium comprising computer readable program means for performing an electromigration analysis for electric circuits placed on a chip, wherein the computer readable program, when executed by a computer, causes the computer to perform a method, the method comprising:
providing at least one interconnect between a driver cell and a load cell;
applying same extracted netlist data for the electromigration analysis and at least one of the following: a noise analysis and a timing analysis;
modeling the driver cell by a train of trapezoidal voltage pulses transmitted from the driver cell to the load cell through the at least one interconnect;
extracting at least one of the following: at least a slew rate of a driver voltage signal, timing information from the noise analysis and the timing analysis for one or more nets in the electric circuits; and
comparing a locally measured current density in the at least one interconnect to an effective local maximum current density limit of the at least one interconnect.

15. The program product of claim 14, wherein the method further comprising:
partitioning the at least one interconnect into segments and/or vias and annotating each segment by its layer number and at least one of the following: wire width and coordinates in the one or more nets generated as layout extraction data.

16. The program product of claim 15, wherein the method further comprising:
measuring by a SPICE-type analysis a current density in at least one of the following: at least one segment and a via.

17. The program product of claim 14, wherein the method further comprising:
setting an individual maximum current density limit for each via connection between metal layers of the at least one interconnect.

18. The program product of claim 14, wherein the method further comprising:
modeling the at least one interconnect as an impedance network.

19. The program product of claim 14, wherein the method further comprising:
averaging the locally measured current density.

20. The program product of claim 14, wherein the method further comprising:
eliminating a DC component in the locally measured current density.

21. The program product of claim 20, wherein the method further comprising:
estimating a maximum value of the locally measured current density after elimination of the DC component.

22. The program product of claim 14, wherein the method further comprising:
determining a failure of at least one of the following:
each wire segment and each via, wherein the determining is performed by comparing the locally measured current density and the effective local maximum current density limit of at least one of the following: each segment and each via.

* * * * *